(12) United States Patent
Anderson et al.

(10) Patent No.: US 11,216,707 B2
(45) Date of Patent: Jan. 4, 2022

(54) MASK REGISTERS TO STORE MASK DATA PATTERNS

(71) Applicant: HEWLETT-PACKARD DEVELOPMENT COMPANY, L.P., Spring, TX (US)

(72) Inventors: Daryl E Anderson, Corvallis, OR (US); Eric Martin, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 149 days.

(21) Appl. No.: 16/491,747

(22) PCT Filed: Apr. 14, 2017

(86) PCT No.: PCT/US2017/027553
§ 371 (c)(1),
(2) Date: Sep. 6, 2019

(87) PCT Pub. No.: WO2018/190855
PCT Pub. Date: Oct. 18, 2018

(65) Prior Publication Data
US 2021/0133520 A1 May 6, 2021

(51) Int. Cl.
*B41J 2/045* (2006.01)
*G06K 15/10* (2006.01)
(Continued)

(52) U.S. Cl.
CPC .......... *G06K 15/107* (2013.01); *B29C 64/209* (2017.08); *B29C 64/393* (2017.08);
(Continued)

(58) Field of Classification Search
CPC ... B41J 2/04568; B41J 2/04586; B33Y 30/00; B33Y 50/02; B29C 64/209
See application file for complete search history.

(56) References Cited

U.S. PATENT DOCUMENTS 6,046,822 A 4/2000 Wen et al.
6,312,079 B1 11/2001 Anderson et al.
(Continued)

FOREIGN PATENT DOCUMENTS

IN 202410 2/2007
JP 2003001820 1/2003
(Continued)

OTHER PUBLICATIONS

Boley, J.W. et al., Effect of Print Masks on the Functional Performance of Inkjet Printed PD Hexadecanethiolate in Toluene. Jul. 18, 2013. < http://www.jwilliamboley.com/pdf>.
(Continued)

*Primary Examiner* — Lamson D Nguyen
(74) *Attorney, Agent, or Firm* — Trop Pruner & Hu PC

(57) ABSTRACT

In some examples, a fluidic die includes a plurality of fluid actuators, an actuation data register to store actuation data that indicates each fluid actuator of the plurality of fluid actuators to actuate, and a plurality of mask registers to store respective different mask data patterns, each mask data pattern of the different mask data patterns indicating a respective set of fluid actuators of the plurality of fluid actuators enabled for actuation for a respective actuation event.

19 Claims, 7 Drawing Sheets

(51) Int. Cl.
  *B33Y 30/00* (2015.01)
  *B33Y 50/02* (2015.01)
  *B29C 64/209* (2017.01)
  *B29C 64/393* (2017.01)
  *G11C 19/00* (2006.01)

(52) U.S. Cl.
  CPC .............. *B33Y 30/00* (2014.12); *B33Y 50/02* (2014.12); *B41J 2/04568* (2013.01); *B41J 2/04586* (2013.01); *G11C 19/00* (2013.01)

(56) References Cited

U.S. PATENT DOCUMENTS

| | | | |
|---|---|---|---|
| 6,454,389 | B1 | 9/2002 | Couwenhoven et al. |
| 6,705,691 | B2 | 3/2004 | Yamane et al. |
| 6,932,453 | B2 | 8/2005 | Feinn et al. |
| 8,016,389 | B2 | 9/2011 | Sheahan et al. |
| 8,070,249 | B2 * | 12/2011 | Takahashi ............ B41J 19/145 347/16 |
| 8,454,127 | B2 | 6/2013 | Nielsen et al. |
| 8,651,632 | B2 | 2/2014 | Marcus et al. |
| 9,061,521 | B2 | 6/2015 | Olson et al. |
| 9,469,125 | B2 | 10/2016 | Humet et al. |
| 9,475,286 | B2 | 10/2016 | Tuttnauer et al. |
| 10,875,298 | B2 * | 12/2020 | Martin ................ B41J 2/04581 |
| 2003/0103105 | A1 | 6/2003 | Kawamura |
| 2005/0190217 | A1 | 9/2005 | Wade et al. |
| 2006/0268056 | A1 | 11/2006 | Molinet et al. |
| 2015/0124019 | A1 | 5/2015 | Cruz-Uribe et al. |
| 2016/0089885 | A1 | 3/2016 | Edelen et al. |
| 2016/0303851 | A1 | 10/2016 | Shepherd |

FOREIGN PATENT DOCUMENTS

| | | |
|---|---|---|
| WO | WO-2015170330 | 11/2015 |
| WO | WO-2018190857 | 10/2018 |
| WO | WO-2018190858 | 10/2018 |
| WO | WO-2018190859 | 10/2018 |

OTHER PUBLICATIONS

HP High Definition Nozzle Architecture, < http://www8.hp.com/h20195/v2/GetPDF.aspx/4AA6-1075ENW.pdf >.

* cited by examiner

MASK REGISTERS TO STORE MASK DATA PATTERNS

BACKGROUND

Fluid control devices such as fluidic dies can control movement and ejection of fluid. Such fluidic dies may include fluid actuators that may be actuated to cause displacement of fluid. Some example fluidic dies may include printheads, where fluids used by the printheads can include ink or other types of fluids.

BRIEF DESCRIPTION OF THE DRAWINGS

Some implementations of the present disclosure are described with respect to the following figures.

Figure 1:
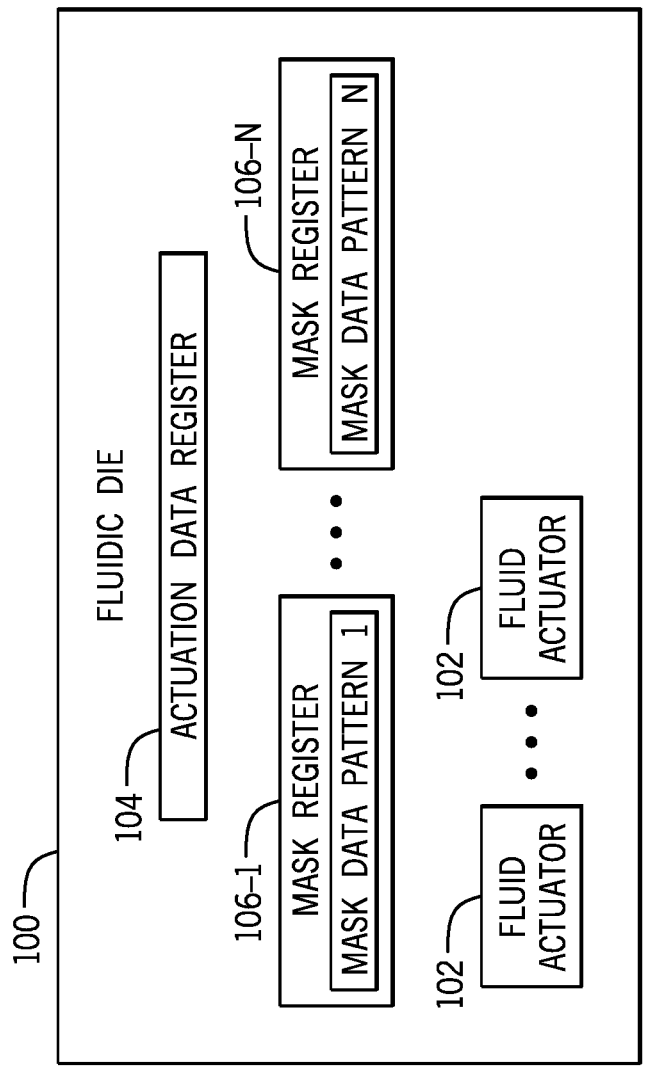
FIG. 1 is a block diagram of a fluidic die according to some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

A fluid control device can include any device that is able to control fluid flow through the fluid control device. For example, the fluid control device can control ejection of a fluid from an orifice of the fluid control device towards a target. In such examples, the fluid control device can be referred to as a fluid ejection device that is able to control ejection of fluids. In some examples, fluid ejection devices can include printheads that are used in two-dimensional (2D) or three-dimensional (3D) printing. In 2D printing, a printhead can eject ink or other printing fluid directed to a target substrate (e.g., paper, plastic, etc.) to print a pattern onto the target substrate. In 3D printing, a printhead can eject a fluid used to form a 3D target object. A 3D printing system can form the 3D target object by depositing successive layers of build material. Printing fluids dispensed from the 3D printing system can include ink, as well as fluids used to fuse powders of a layer of build material, detail a layer of build material (such as by defining edges or shapes of the layer of build material), and so forth.

In other examples, a fluid control device can include pumps that control fluid flows through respective fluid channels. More generally, a fluid control device can be used in either a printing application or a non-printing application. Examples of fluid control devices used in non-printing applications include fluid control devices in fluid sensing systems, medical systems, vehicles, fluid flow control systems, and so forth. In a printing application, a fluid control device, such as a fluidic die, can be mounted onto a print cartridge, where the print cartridge can be removably mounted in a print system. For example, the fluidic die can be a printhead die that is mounted to the print cartridge. In another example of a printing application, fluid control devices (such as fluidic dies) can be mounted onto a print bar that spans the width of a target medium (e.g., a paper medium or medium of another material) onto which printing fluids are to be dispensed.

A fluid control device can include multiple fluid actuators that when actuated causes displacement of fluid. As used here, displacement of fluid can refer to movement of fluid within a fluid channel inside the fluid control device, or to ejection of fluid from inside a fluid chamber of the fluid control device through an orifice to a region outside the fluid control device.

The multiple fluid actuators of a fluid control device can be partitioned into "primitives," where a primitive (or equivalently a "firing primitive") includes a group of a certain number of fluid actuators. Each fluid actuator of a primitive can be uniquely addressed to select the fluid actuator.

In some examples, electrical and fluidic constraints of a fluidic control device may restrict a number of fluid actuators that can be actuated concurrently for a given actuation event. For example, to reduce a peak electrical current in the fluid control device, only one fluid actuator (or a smaller number of fluid actuators) is (are) activated in each primitive for the given actuation event.

An actuation event can refer to concurrent actuation of fluid actuators of a fluid control device to cause corresponding fluid displacement.

A number of fluid actuators included in a primitive can be referred to as a size of the primitive. Traditionally, primitives of a fluid control device are configured using hardware circuitry, and thus a size of the primitives used in the fluid control device is fixed. Using a fixed-size primitive reduces flexibility in the control of fluid displacement. For example, it may be difficult using fixed-size primitives to switch between different modes of fluid displacement (e.g., different printing modes of a printing system), particularly when switching between the different modes of fluid displacement is to occur on the fly during a fluid displacement operation (e.g., during a printing operation).

In accordance with some implementations of the present disclosure, variable-sized primitives can be used in a fluid control device. For a first actuation event (or a first set of actuation events), primitives of a first primitive size can be used, while for a second actuation event (or second set of actuation events), primitives of a second primitive size (different from the first primitive size) can be used. Varying sizes of primitives can be implemented by using different mask data patterns in mask registers of the fluid control device. A first mask data pattern can specify the first primitive size, while a second mask data pattern can specify the second primitive size. To improve throughput of the fluid control device when switching between different mask data patterns, the different mask data patterns can be stored in respective mask registers. A multiplexer can select from among the mask registers to select the mask data pattern to use for each given actuation event (or each given set of actuation events).

FIG. 1 is a block diagram of an example fluidic die 100. A fluidic die can refer to a structure that includes a substrate on which are provided various layers (e.g., thin film layers) to form fluid channels, orifices, fluid actuators, fluid chambers, electrical conductors, and so forth.

The fluidic die 100 includes multiple fluid actuators 102. The fluid actuators 102 can be arranged as an array of fluid actuators, which can be a 1-dimensional (1D) array of fluid actuators or a two-dimensional (2D) array of fluid actuators. In other examples, the fluid actuators 102 can be arranged in a different pattern.

Although FIG. 1 depicts various components of a fluidic die, it is noted that in other examples, similar components can be arranged in other types of fluid control devices.

In some examples, a fluid actuator 102 can be disposed in a nozzle of the fluidic die 100, where the nozzle may include a fluid chamber and a nozzle orifice in addition to the fluid actuator. The fluid actuator may be actuated such that displacement of fluid in the fluid chamber may cause ejection of a fluid drop through the nozzle orifice. Accordingly, a fluid actuator disposed in a nozzle may be referred to as a fluid ejector.

A fluid actuator 102 can include an actuator that includes a piezoelectric membrane, an actuator that includes a thermal resistor, an actuator that includes an electrostatic membrane, an actuator that includes a mechanical/impact driven membrane, an actuator that includes a magneto-strictive drive actuator, or other such elements that may cause displacement of fluid responsive to electrical actuation or actuation resulting from another type of input stimulus.

In some examples, the fluidic die 100 can include microfluidic channels. Microfluidic channels may be formed by performing etching, microfabrication (e.g., photolithography), micromachining processes, or any combination thereof in a substrate of the fluidic die 100. A microfluidic channel may include a fluid channel of specified small size (e.g., of nanometer sized scale, micrometer sized scale, millimeter sized scale, etc.) to facilitate conveyance of small volumes of fluid (e.g., picoliter scale, nanoliter scale, microliter scale, milliliter scale, etc.).

Some example substrates of fluidic dies can include silicon based substrates, glass based substrates, gallium arsenide based substrates, and/or other such suitable types of substrates for micro fabricated devices and structures. Accordingly, microfluidic channels, chambers, orifices, and/or other such features may be defined by surfaces fabricated in the substrate of the fluidic die 100. The fluid actuators 102 (or a subset of the fluid actuators 102) can be disposed in respective microfluidic channels. In such examples, actuation of a fluid actuator 102 disposed in a microfluidic channel can generate fluid displacement in the microfluidic channel. Accordingly, a fluid actuator 102 disposed in a microfluidic channel may be referred to as a fluid pump.

As further shown in FIG. 1, the fluidic die 100 includes an actuation data register 104, and multiple mask registers 106-1 to 106-N, where N≥2. A "register" can refer to any storage element that can be used to store data. For example, a register can be part of a portion of a memory device, such as a dynamic random access memory (DRAM), a static random access memory (SRAM), a flash memory, or any other type of memory device. Alternatively, a register can refer to a storage buffer, a data latch, or any other data holding device that can temporarily or persistently store data.

The actuation data register 104 can store actuation data that indicates each fluid actuator to actuate for a set of actuation events. Actuating a fluid actuator refers to causing operation of the fluid actuator to perform fluid displacement in the fluidic die 100. As noted above, an actuation event can refer to concurrent actuation of fluid actuators of the fluidic die 100 to cause fluid displacement. An actuation event can be responsive to a command issued to the fluidic die, or a command issued in the fluidic die, to cause fluid displacement to occur. A "set of actuation events" can refer to any sequence or collection of events that can cause respective different groups of fluid actuators 102 to actuate.

Assuming there are M (M≥1) fluid actuators 102, the actuation data stored in the actuation data register 104 includes M values that correspond to the M fluid actuators 102. In some examples, each value of the M values can be provided by a single bit, where a first state of the bit indicates that the corresponding fluid actuator 102 is to be actuated, and a different second state of the bit indicates that the corresponding fluid actuator 102 is to remain un-actuated. In other examples, each value of the M values in the actuation data can be represented using multiple bits, where a first value of the multiple bits indicates that a corresponding fluid actuator 102 is to be actuated, and a different second value of the multiple bits indicates that the corresponding fluid actuator 102 is to remain un-actuated.

Each mask register 106-1 to 106-N can store a respective mask data pattern that indicates a subset of the fluid actuators 102 that is (are) enabled for actuation for a respective actuation event or the set of actuation events. Enabling a fluid actuator for actuation can refer to allowing the fluid actuator to be activated in response to a value of the actuation data in the actuation data register 104 specifying that the fluid actuator is to be actuated.

A mask data pattern stored in a mask register (any of 106-1 to 106-N) can have M values that correspond to M fluid actuators 102. Each value of the M values in the mask data pattern can be provided by a single bit or can be provided by multiple bits.

In other words, if a value of a mask data pattern indicates that a particular fluid actuator is not enabled for actuation, then the particular fluid actuator will not be actuated even though the actuation data stored in the actuation data register 104 specifies that the particular fluid actuator 102 should be actuated. On the other hand, if a mask data pattern specifies that the particular fluid actuator is enabled for actuation, the particular fluid actuator is actuated only if the actuation data stored in the actuation data register 104 specifies that the particular fluid actuator is to be actuated. More specifically, a given fluid actuator 102 is to be actuated in response to both a value of the actuation data register 104 specifying that the given fluid actuator 102 is to be actuated, and a corresponding value of the mask data pattern enabling actuation of the given fluid actuator 102.

As shown in FIG. 1, the mask register 106-1 stores mask data pattern 1, and the mask register 106-N stores mask data pattern N. The mask data patterns stored in respective mask registers can be different from one another. For example, the mask data pattern 1 can be different from the mask data pattern N. As noted above, different mask data patterns can specify different primitive sizes for primitives, where a primitive can include a number of the fluid actuators 102. Generally, the fluid actuators 102 of the fluidic die 100 can be partitioned into multiple primitives, where each primitive can include a number of fluid actuators 102 based on the primitive size specified by a mask data pattern of a selected one of the mask registers 106-1 to 106-N.

Figure 2:
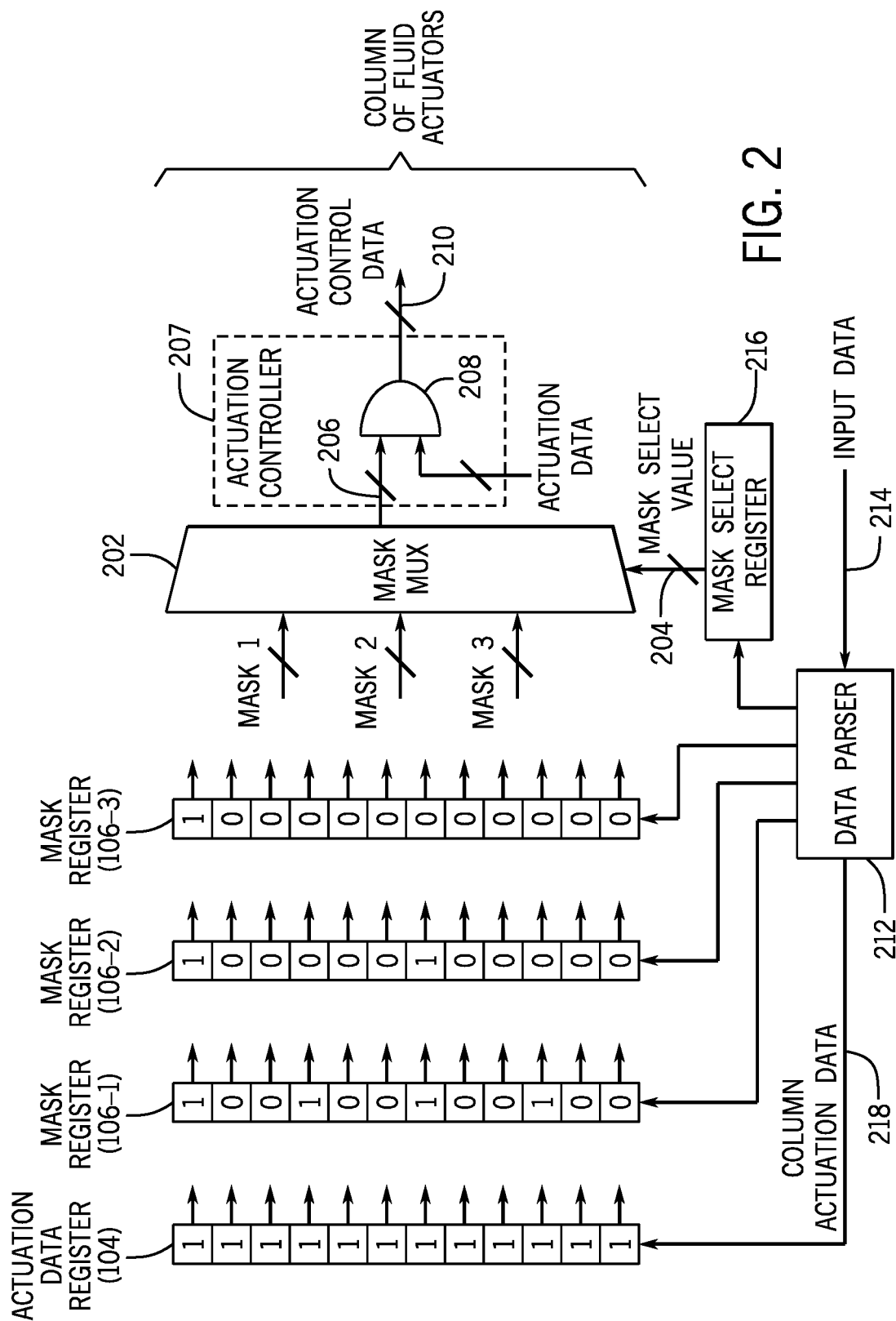
FIG. 2 is a block diagram of a fluidic die according to further examples.

FIG. 2 shows an example arrangement of a fluidic die that includes the actuation data register 104 and three mask registers 106-1, 106-2, and 106-3. Although a specific number of mask registers are shown, it is noted that in different examples, different numbers of mask registers can be used. The logic shown in FIG. 2 controls actuation of a column of fluid actuators. Similar logic can be repeated for other columns of fluid actuators.

In some examples, an array of the fluid actuators 102 can be arranged as rows and columns. In the example shown in FIG. 2, it is assumed that a column includes 12 actuators, such that each of the actuation data register 104 and mask registers 106-1 to 106-3 stores 12 bits of data. In a different example, a column of fluid actuators can include a different number of fluid actuators. The example actuation data stored in the actuation data register 104 is all "1"s, to specify that all of the fluid actuators in the column are to be actuated. In other examples, a different actuation data can be stored in the actuation data register 104.

The mask registers 106-1, 106-2, and 106-3 store respective different mask data patterns, where each mask data pattern includes 12 bits to correspond to the 12 fluid actuators in the column.

In examples shown in FIG. 2, it is assumed that a "1" value indicates an active state, while a "0" value indicates an inactive state. Thus, a "1" value in the actuation data register indicates that a respective fluid actuator is to be actuated, while a "0" value in the actuation data register 104 indicates that the respective fluid actuator is not to be actuated. A "1" value in the mask register indicates that a respective fluid actuator is enabled for actuation, while a "0" value in the mask register indicates that the respective fluid actuator is not enabled for actuation.

A mask multiplexer 202 selects a mask data pattern from among the three mask data patterns stored in the respective mask registers 106-1, 106-2, and 106-3. A "multiplexer" can refer to any logic that is able to select from among multiple inputs, where the selected input is provided to the output of the multiplexer. In FIG. 2, the three different mask patterns are represented as Mask 1 (from the mask register 106-1), Mask 2 (from the mask register 106-2), and Mask 3 (from the mask register 106-3), which are provided to three sets of inputs of the mask multiplexer 202. A mask select value 204 is provided to the select control input of the mask multiplexer 202, to select one of the mask data patterns to propagate to the output 206 of the mask multiplexer 202. Note that each of the inputs of the mask multiplexer 202 and the output 206 of the mask multiplexer 202 is 12 bits in width.

The mask select value 204 is a value stored in a mask select register 216 (discussed further below).

The output 206 of the mask multiplexer 202 is provided to an input of an actuation controller 207. A "controller" as used herein can refer to any hardware processing circuit, which can include logic circuitry, a microprocessor, a core of a multi-core microprocessor, a microcontroller, a programmable gate array, a programmable integrated circuit device, or any other hardware processing circuit. In further examples, a controller can include a combination of a hardware processing circuit and machine-readable instructions executable on the hardware processing circuit.

The actuation data from the actuation data register 104 is also provided to an input of the actuation controller 207. In the example of FIG. 2, the output 206 of the mask multiplexer 202 and the actuation data are each 12 bits in width. The actuation controller 207 includes an AND function 208, which receives as input the mask multiplexer output 206 (containing the selected mask data pattern, as selected from among Mask 1, Mask 2, and Mask 3) and the actuation data from the actuation data register 104, and produces as output an actuation control data 210 (also 12 bits in width). Each bit of the actuation control data 210 is a logical AND of a respective bit of the selected mask data pattern, and the corresponding bit of the actuation data. A bit of the actuation control data 210 is active in response to both the corresponding bit of the selected mask data pattern and the corresponding bit of the actuation data being active. Although an AND function 208 is depicted, it is noted that in other examples, other logic for producing the actuation control data 210 based on the actuation data and the selected mask data pattern can be used. The concept is that an actuation control bit (or other value) of the actuation control data 210 for actuating a respective fluid actuator is set to an active value in response to both the corresponding actuation data bit (or other value) in the actuation data and the mask data bit (or other value) in the selected mask data pattern being set to an active value.

The actuation controller 207 can include other logic not shown, in addition to the AND function 208. For example, the actuation controller 207 can include a register to store the actuation control data 210. The actuation control data 210 is provided to the column of fluid actuators (or activation circuits of the fluid actuators) to actuate selected fluid actuators in the column. The fluid actuators not selected (because either the corresponding bit in the actuation data or the corresponding bit in the selected mask data pattern is inactive) remain inactive (i.e., not actuated).

The mask select value 204 causes the mask multiplexer 202 to select a first mask register for a first set of actuation events, and select a second mask register for a second set of actuation events. For the first set of actuation events, the actuation controller 207 controls actuation of the fluid actuators 102 based on actuation data in the actuation data register 104 and the mask data pattern in the first mask register. For the second set of actuation events, the actuation controller 207 controls actuation of the fluid actuators 102 based on actuation data in the actuation data register 104 and the mask data pattern in the second mask register.

FIG. 2 further shows a data parser 212 that receives input data 214. The input data 214 can be provided by a fluid control system to the fluidic die shown in FIG. 2. In different phases of operation, the data parser 212 causes loading of the actuation data register 104 and selected mask register(s). The data parser 212 is a form of data loading logic to control loading of data into respective registers. The data parser 212 writes column actuation data 218 into the actuation data register 104 during a fluid displacement phase, during which the fluidic die causes displacement of fluid (e.g., eject fluid during a printing operation). The data parser 212 writes a mask data pattern into a selected mask register (106-1, 106-2, or 106-3) during a mask register write phase, which can be part of initialization of the fluidic die, as well as in subsequent phases when updating of the mask data pattern in a mask register is to be performed.

The data parser 212 can also write a mask select value into the mask select register 216, where the mask select value is to select from among the mask data patterns Mask 1, Mask 2, and Mask 3 for output by the mask multiplexer 202. Details of the operation of the data parser 212 are explained further below.

As noted above, different mask data patterns, such as the different mask data patterns shown in the mask registers 106-1 to 106-3, can indicate different primitive sizes. Thus, in the example of FIG. 2, the mask data pattern (Mask 1) stored in the mask register 106-1 indicates a first primitive size, the mask data pattern (Mask 2) stored in the mask register 106-2 indicates a second primitive size, and the mask data pattern (Mask 3) stored in the mask register 106-3 indicates a third primitive size, where the first, second, and third primitive sizes are different from each other.

Figure 3B:
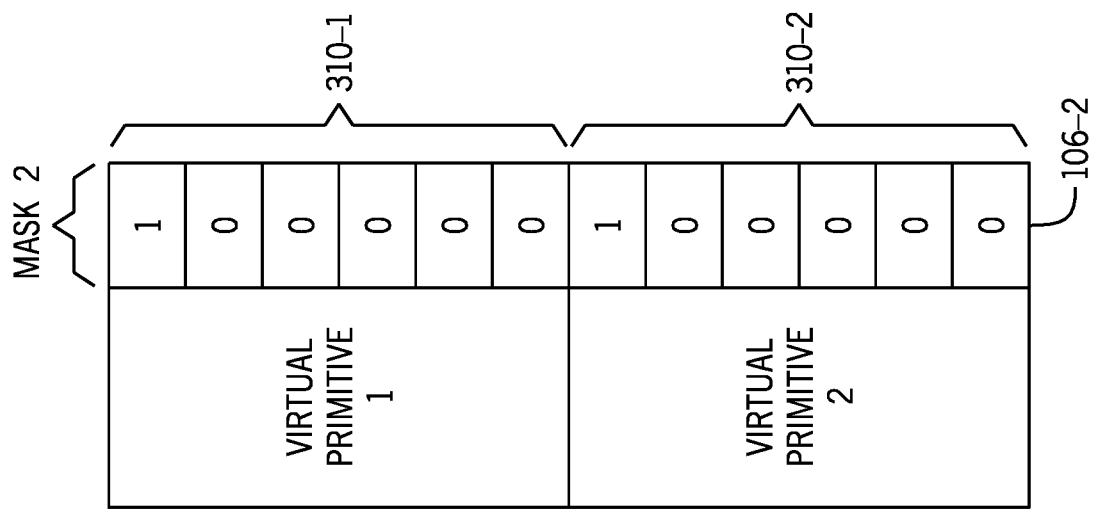
FIGS. 3A and 3B illustrate virtual primitives corresponding to respective different mask data patterns.
Figure 3A:
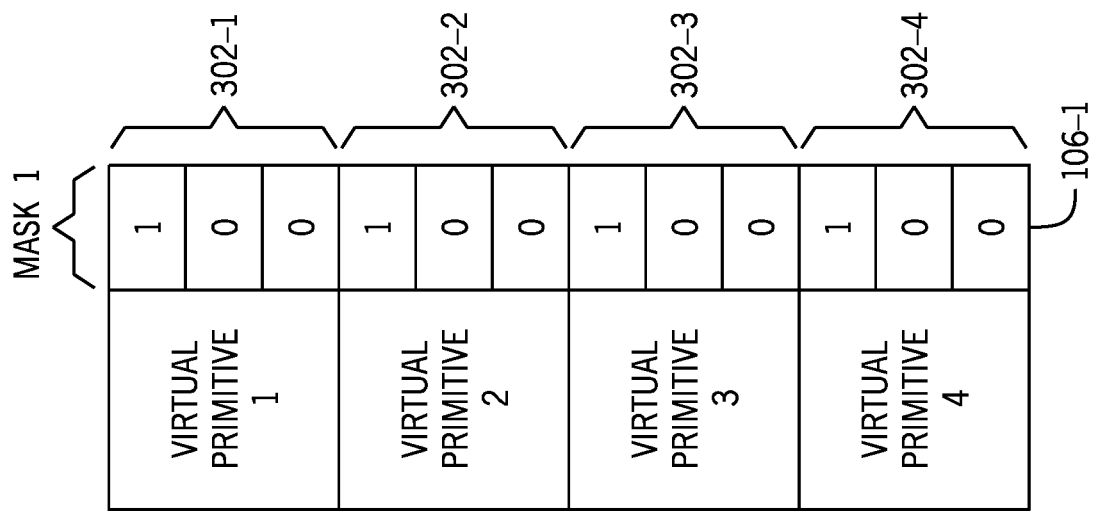

FIG. 3A shows an example of virtual primitives corresponding to the first primitive size specified by mask data pattern Mask 1, which is stored in the mask register 106-1. As used here, a "virtual primitive" can refer to a primitive with a size that can be dynamically changed by using different mask data patterns. The mask data pattern Mask 1 indicates a primitive size of 3 (i.e., each primitive includes three fluid actuators). Since each primitive includes three fluid actuators, the 12 fluid actuators of a column are divided into four virtual primitives. FIG. 3A shows four virtual primitives 1, 2, 3, and 4.

The mask data pattern Mask 1 is divided into four groups 302-1 to 302-4 of mask data pattern bits. Each group 302-1, 302-2, 302-3, or 302-4 contains three mask data pattern bits, where each mask data pattern bit effectively addresses a respective fluid actuator. Thus, if a bit in a mask data pattern group is set to "1" (or other active state or active value), then the corresponding fluid actuator is addressed (enabled) for actuation. On the other hand, if a bit in a mask data pattern group is set to "0" (or other inactive state or inactive value), then the corresponding fluid actuator is not addressed for actuation (i.e., the corresponding fluid actuator is disabled). In some examples, within each mask data pattern group 302-1, 302-2, 302-3, or 302-4, just one bit is set to the active state "1" while the remaining bits are set to the inactive state "0." In other examples, more than one bit in each mask data pattern group can be set to the active state "1".

As shown in FIG. 3B, the mask data pattern Mask 2 stored in the mask register 106-2 indicates a primitive size of 6. In FIG. 3B, two virtual primitives 1 and 2 each of size 6 are depicted. Each virtual primitive 1 or 2 is associated with a respective group 310-1 or 310-2 of mask data pattern bits. In some examples, within each mask data pattern group 310-1 or 310-2, just one bit is set to the active state "1" while the remaining bits are set to the inactive state "0." In other examples, more than one bit in each mask data pattern group can be set to the active state "1".

The mask data pattern Mask 3 indicates a primitive size of 12, which is the size of the entire column in the example of FIG. 2. In other examples, other mask data patterns can indicate other primitive sizes.

Effectively, the mask data patterns specify the virtual address structure to be used in a given column of fluid actuators. Each mask data pattern defines a number of virtual addresses, and how many fluid actuators to fire within a virtual primitive at a time. Although the examples shown in FIGS. 2 and 3A-3B depict just one fluid actuator being enabled for actuation in response to a particular actuation event, it is noted that in other examples, more than one fluid actuator can be actuated in the given virtual primitive in response to a particular actuation event.

Figure 4:
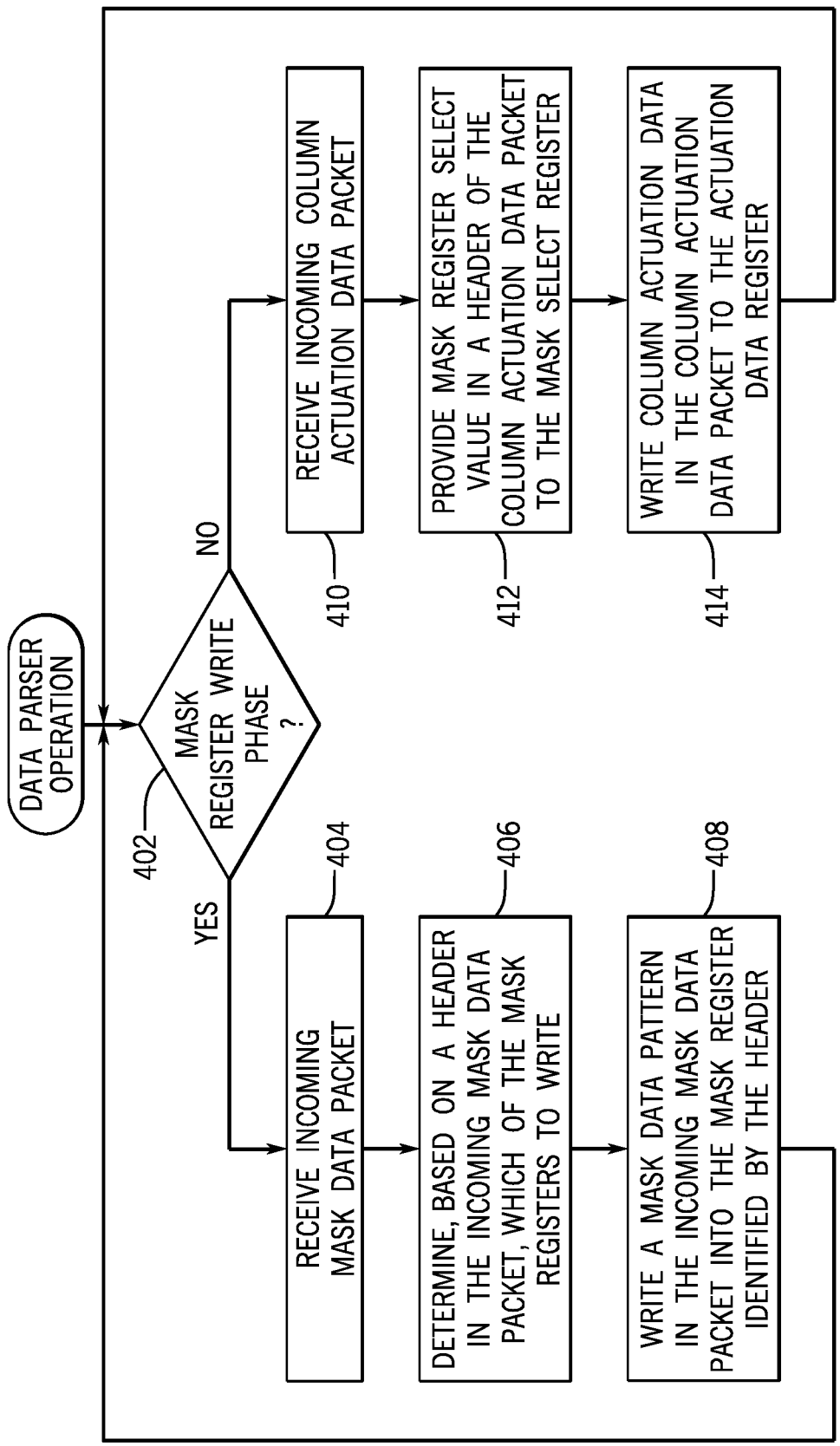
FIG. 4 is a flow diagram of a process of a data parser according to some examples.

FIG. 4 is a flow diagram of an example operation of the data parser 212 of FIG. 2, according to some implementations of the present disclosure. The data parser 212 can be operated in one of two phases: a mask register write phase or a fluid displacement phase. During the mask register write phase, a mask data pattern is loaded into a mask register (or multiple mask data patterns are loaded into respective mask registers). In the fluid displacement phase, column actuation data is loaded into the actuation data register, and one of the mask registers is selected to use for enabling actuation of fluid actuators.

As shown in FIG. 4, the data parser 212 determines (at 402) whether the data parser 212 is in the mask register write phase or in the fluid displacement phase. This determination can be based on an indication provided by a fluid control system (e.g., a controller of a printing system) to the data parser 212. A first indication can indicate to the data parser 212 that the data parser 212 is to operate in the mask register write phase, while a second indication indicates that the data parser 212 is to operate in the fluid displacement phase. The first or second indication can be provided as a respective command, message, information field (such as in a header or payload of a data packet), and so forth.

In response to determining that the data parser 212 is to operate in the mask register write phase, the data parser 212 receives (at 404) an incoming mask data packet. As used here, a "data packet" can refer to any collection of data values, whether contained as a single unit of data or as multiple units of data. The data packet can include a header and a payload, where the payload carries the mask data pattern, and the header contains control information.

The parser 212 determines (at 406), based on the header in the incoming mask data packet, which of the mask registers 106-1, 106-2, or 106-3 to write. The header of the incoming mask data packet can include an information field that is settable to one of multiple different values that correspond to selection of different ones of the mask registers 106-1, 106-2, and 106-3.

The data parser 212 then writes (at 408) a mask data pattern in the payload of the incoming mask data packet into the mask register identified by the header of the incoming data packet.

The process then returns to task 402. In the next iteration, another mask register write phase can be performed to write to another mask register.

If the data parser 212 determines (at 402) that the data parser 212 is not in the mask register write phase (i.e., the data parser 212 is in the fluid displacement phase), the data parser 212 receives (at 410) an incoming column actuation data packet. The incoming column actuation data packet includes a header and a payload, where the payload contains the column actuation data.

In some cases, the header of the column actuation data packet can include a mask register select value. Note that not all incoming column actuation data packets would include a mask register select value. In other examples, each incoming column actuation data packet would include a header with a mask register select value, where the mask register select value is for loading into the mask select register 216 (FIG. 2) and is used in selecting one of the mask data patterns in the mask registers 106-1, 106-2, and 106-3.

The data parser 212 provides (at 412) the mask register select value in the header of the column actuation data packet to the mask select register 216. The mask select register 216 stores the mask register select value, which is provided to the control input of the mask multiplexer 202 shown in FIG. 2 to select one of the multiple inputs to the mask multiplexer 202. Updating the mask register select value in the mask select register 216 causes selection of a different mask data pattern.

The data parser 212 further writes (at 414) the column actuation data in the payload of the column actuation data packet to the actuation data register 104.

The process then returns to task 402.

Figure 5:
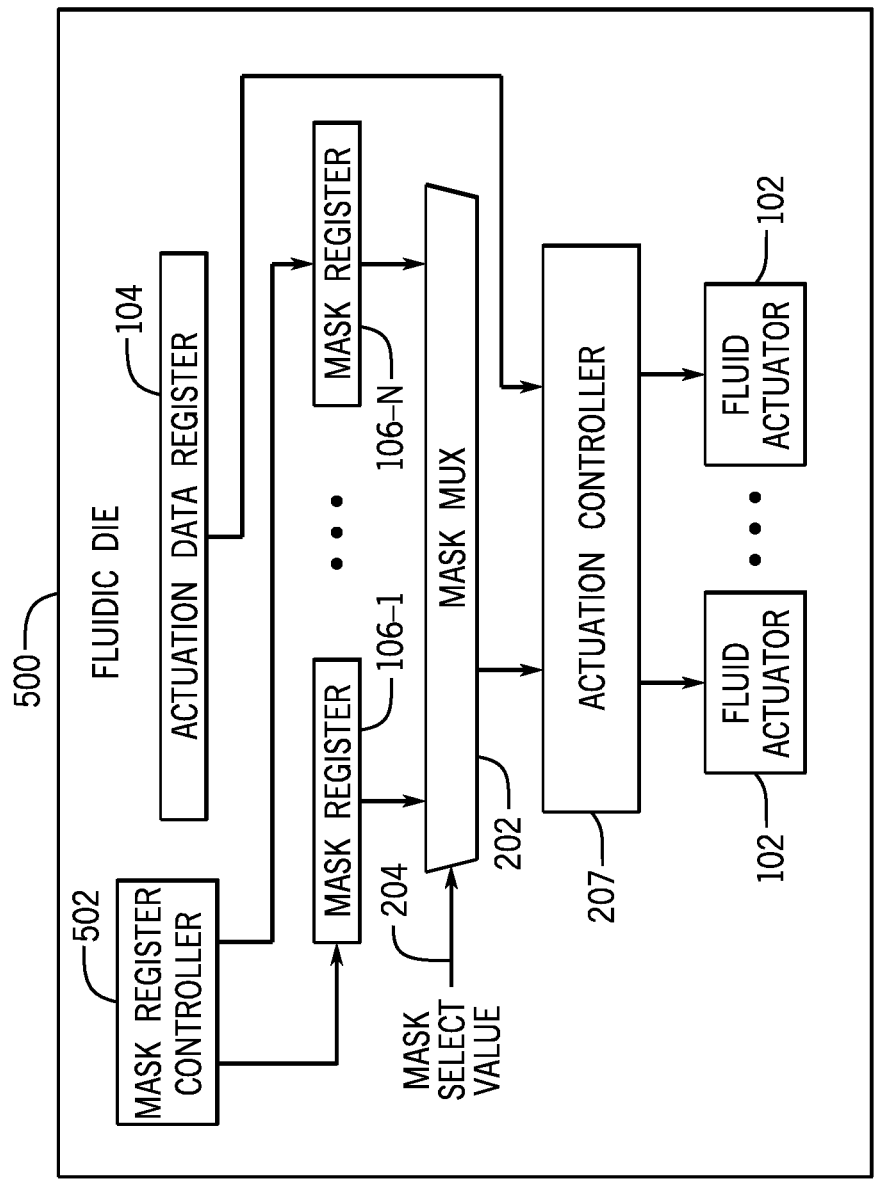
FIG. 5 is a block diagram of a fluidic die according to further examples.

FIG. 5 is a block diagram of a fluidic die 500 according to further examples. The fluidic die 500 includes various components that are similar to those of FIG. 1 and/or FIG. 2, including the actuation data register 104, the mask registers 106-1 to 106-N, the mask multiplexer 202, the actuation controller 207, and the fluid actuators 102.

The fluidic die 500 further includes a mask register controller 502, which controls a shifting operation of a selected mask register of the mask registers 106-1 to 106-N. As noted above, in some examples, within a given virtual primitive, just one fluid actuator of the virtual primitive is actuated in response to a respective actuation event. To actuate all of the fluid actuators of the virtual primitive, a set of actuation events are provided, where each successive actuation event of the set corresponds to actuation of a next fluid actuator of the virtual primitive.

Figure 6:
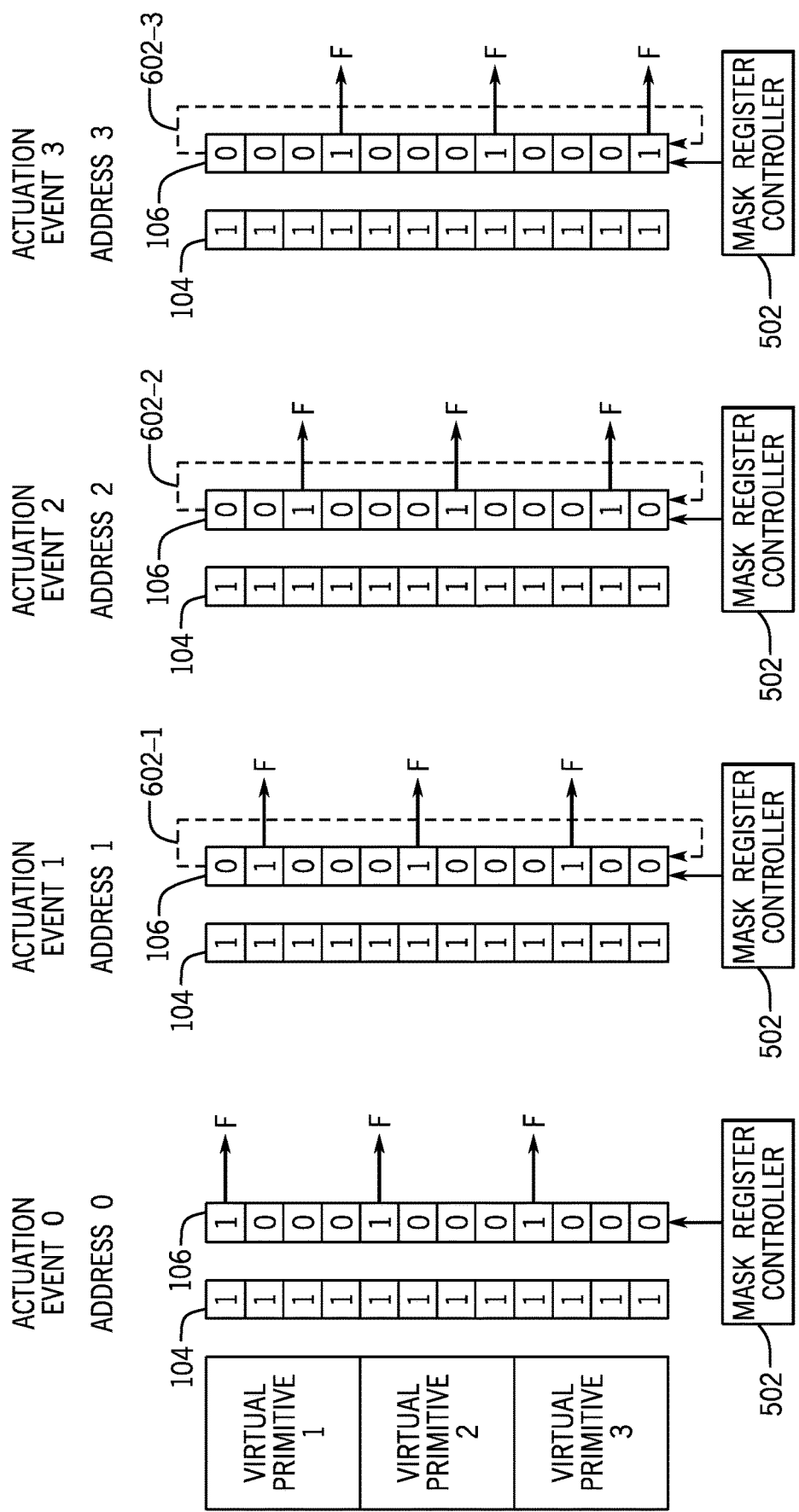
FIGS. 6A-6D illustrate shifting of a mask data pattern in a mask register, according to additional examples.

FIGS. 6A-6D show an example where a selected mask data pattern (in a mask register 106) indicates a primitive size of four, i.e., each virtual primitive has four fluid actuators. Assuming a column of 12 fluid actuators, the column is divided into three virtual primitives 1, 2, and 3 (as shown in FIG. 6A). A set of four actuation events (actuation event 0, actuation event 1, actuation event 2, and actuation event 3) is provided to cause actuation of the four fluid actuators in each virtual primitive at four successive times.

FIG. 6A shows actuation event 0, in which address 0 is selected by the mask data pattern in the mask register 106. The fluid actuators in the three virtual primitives assigned address 0 are enabled for actuation. The actuation data register 104 contains all "1"s in the example, while the mask data pattern of the selected mask register 106 contains the following mask data pattern: 100010001000. An "F" indicates the respective fluid actuator (associated with address 0) in each of the three virtual primitives 1, 2, and 3 that is actuated in response to the combination of an actuation data bit and a mask data pattern bit.

For actuation event 1, as shown in FIG. 6B, the mask register controller 502 causes a first shift operation 602-1 to occur in the selected mask register 106. In the example of FIG. 6B, the head of the mask register 106 is shifted into the tail of the mask register 106, and the mask data pattern bits in the selected mask register 106 are shifted by three bit positions in the example shown. Shifting by three bit positions means that each bit in the mask register 106 is shifted along the shift direction by three positions in the mask register 106. In the example of FIG. 6B, the shift operation 602-1 in response to actuation event 1 causes address 1 to be selected in each virtual primitive. An "F" in FIG. 6B indicates the fluid actuator (associated with address 1) in each virtual primitive that is actuated.

FIG. 6C shows actuation event 2, where the mask register controller 502 causes a second shift operation 602-2 of the selected mask register 106 by three bit positions. The shift operation 602-2 in response to actuation event 2 causes address 2 to be selected.

For actuation event 3, as shown in FIG. 6D, the mask register controller 502 causes a third shift operation 602-3 of the shift register 106 by 3 bit positions. This causes address 3 to be selected.

More generally, the mask register controller 502 is to shift the mask data pattern in the selected mask register 106 in response to each actuation event of a set of actuation events, where the shifting is to cause enabling of a different set of fluid actuators for each successive actuation event. The shifting of the mask data pattern in the selected mask register 106 can include a circular shift (as shown in FIGS. 6A-6D), or another type of shift, such as a bi-directional shift, first-in-first-out (FIFO) shift, or any other type of movement of bits in the mask register.

Figure 7:
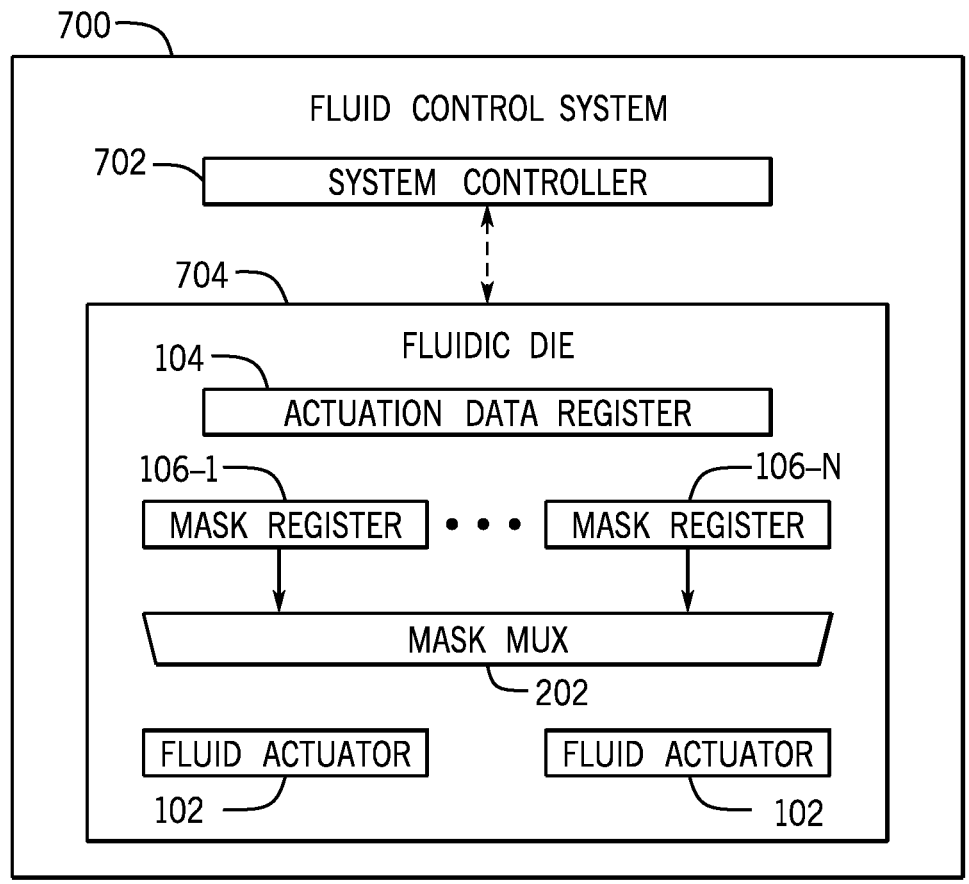
FIG. 7 is a block diagram of a fluid control system according to further examples.

FIG. 7 is a block diagram of an example fluid control system 700, which can be a printing system or any other system in which fluid displacement can be controlled. The fluid control system 700 includes a system controller 702. In a printing system, the system controller 702 is a printer controller.

The fluid control system 700 further includes a fluidic die 704, which includes a plurality of fluid actuators 102, an actuation data register 104 to store actuation data, a plurality of mask registers 106-1 to 106-N to store respective different mask data patterns, and a mask multiplexer 202 responsive to information from the system controller 702 to selectively select different mask registers at different times.

The system controller 702 provides different information to the fluidic die 704 to cause the multiplexer 202 to select different mask registers to perform dynamic mode switching among different modes of the fluid control system 700.

Figure 8:
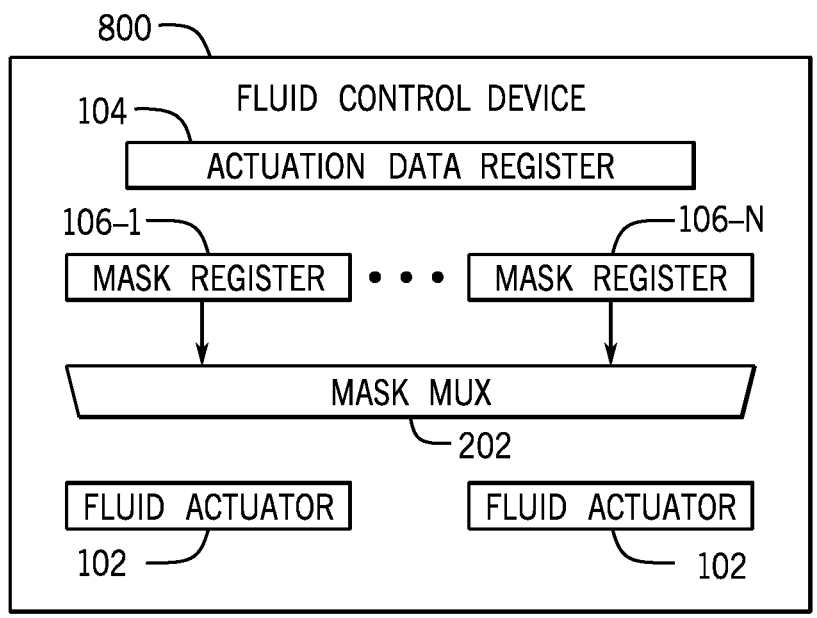
FIG. 8 is a block diagram of a fluid control device according to alternative examples.

FIG. 8 is a block diagram of a fluid control device 800 that includes a plurality of fluid actuators 102, an actuation data register 104 to store actuation data, a plurality of mask registers 106-1 to 106-N to store respective different mask data patterns, and a mask multiplexer 202 to select different mask registers for respective different sets of actuation events.

As noted above, in some examples, certain logic (such as the various controllers) can be implemented as either a hardware processing circuit or as a combination of a hardware processing circuit and machine-readable instructions (software or firmware) executable on the hardware processing circuit.

In examples where machine-readable instructions are employed, the machine-readable instructions can be stored in a non-transitory machine-readable or computer-readable storage medium.

The storage medium can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A fluidic die comprising:
   a plurality of fluid actuators;
   an actuation data register to store actuation data that indicates each fluid actuator of the plurality of fluid actuators to actuate; and
   a plurality of mask registers to store respective different mask data patterns, each mask data pattern of the different mask data patterns indicating a respective set of fluid actuators of the plurality of fluid actuators enabled for actuation for a respective actuation event, wherein the different mask data patterns correspond to different primitive sizes, wherein a primitive of a first primitive size of the different primitive sizes includes a first number of fluid actuators, and a primitive of a second primitive size of the different primitive sizes includes a second number of fluid actuators, the second number different from the first number.

2. The fluidic die of claim 1, further comprising:
   a multiplexer to select a mask register of the plurality of mask registers; and
   an actuation controller to control actuation of a set of fluid actuators of the plurality of fluid actuators based on the actuation data in the actuation data register and the mask data pattern in the selected mask register.

3. The fluidic die of claim 2, wherein the multiplexer is to select a first mask register of the plurality of mask registers for a first set of actuation events, and to select a second mask register of the plurality of mask registers for a second set of actuation events, and
   the actuation controller is to:
      for the first set of actuation events, control actuation of the plurality of fluid actuators based on actuation data in the actuation data register and the mask data pattern in the first mask register, and
      for the second set of actuation events, control actuation of the plurality of fluid actuators based on actuation data in the actuation data register and the mask data pattern in the second mask register.

4. The fluidic die of claim 2, wherein the multiplexer is to select the mask register of the plurality of mask registers according to information received from a fluid ejection system that includes the fluidic die.

5. The fluidic die of claim 4, wherein the information is part of a header of a received data packet comprising the actuation data.

6. The fluidic die of claim 2, further comprising:
   a mask register controller to shift the mask data pattern in the selected mask register in response to each actuation event of a set of actuation events, the shifting to cause enabling of another set of fluid actuators.

7. The fluidic die of claim 6, wherein the multiplexer to select, for another set of actuation events, another mask register of the plurality of mask registers, to control actuation of respective sets of fluid actuators of the plurality of fluid actuators based on the mask data pattern in the another mask register.

8. The fluidic die of claim 1, wherein each mask data pattern of the different mask data patterns specifies a corresponding different number of virtual addresses to use in actuating fluid actuators.

9. A fluidic die comprising:
   a plurality of fluid actuators, wherein the fluid actuators comprise:
      fluid ejectors in respective nozzles; or
      fluid pumps in respective microfluidic channels;
   an actuation data register to store actuation data that indicates each fluid actuator of the plurality of fluid actuators to actuate; and
   a plurality of mask registers to store respective different mask data patterns, each mask data pattern of the different mask data patterns indicating a respective set of fluid actuators of the plurality of fluid actuators enabled for actuation for a respective actuation event.

10. The fluidic die of claim 9, wherein the different mask data patterns correspond to different primitive sizes, wherein a primitive of a first primitive size of the different primitive sizes includes a first number of fluid actuators, and a primitive of a second primitive size of the different primitive sizes includes a second number of fluid actuators, the second number different from the first number.

11. The fluidic die of claim 9, further comprising a multiplexer to select, based on information in a header of a data packet comprising the actuation data, a mask register of the plurality of mask registers.

12. The fluidic die of claim 9, further comprising a mask register controller to shift the mask data pattern in a given mask register of the plurality of mask registers, in response to each actuation event of a set of actuation events, the shifting to cause enabling of another set of fluid actuators.

13. A fluid control system comprising:
   a system controller; and
   a fluidic die comprising:
      a plurality of fluid actuators;
      an actuation data register to store actuation data, the actuation data indicating each fluid actuator of the plurality of fluid actuators to actuate;
      a plurality of mask registers to store respective different mask data patterns, each mask data pattern of the different mask data patterns indicating a respective set of fluid actuators of the plurality of fluid actuators enabled for actuation for a respective actuation event; and
      a multiplexer responsive to information from the system controller to selectively select mask registers of the plurality of mask registers at different times.

14. The fluid control system of claim 13, wherein the system controller is to provide different information to the multiplexer to cause selection of different mask registers of the plurality of mask registers to perform dynamic mode switching among different modes of the fluid control system.

15. The fluid control system of claim 13, wherein the fluidic die is to:
   write the different mask data patterns into corresponding mask registers of the plurality of mask registers during a mask register write phase, and
   write the actuation data to the actuation data register during a fluid displacement phase.

16. The fluid control system of claim 13, wherein the different mask data patterns correspond to different primitive sizes, wherein a primitive of a first primitive size of the different primitive sizes includes a first number of fluid actuators, and a primitive of a second primitive size of the different primitive sizes includes a second number of fluid actuators, the second number different from the first number.

17. A fluid control device comprising:
   a plurality of fluid actuators;
   an actuation data register to store actuation data that indicates each fluid actuator of the plurality of fluid actuators to actuate;
   a plurality of mask registers to store respective different mask data patterns, each mask data pattern of the different mask data patterns indicating a respective set of fluid actuators of the plurality of fluid actuators enabled for actuation;

a multiplexer to select different mask registers of the plurality of mask registers for respective different sets of actuation events.

18. The fluid control device of claim 17, further comprising:

a mask register controller to shift the mask data pattern in a selected mask register selected by the multiplexer, the shifting being responsive to each actuation event of a first set of actuation events of the different sets of actuation events.

19. The fluid control device of claim 17, wherein the different mask data patterns correspond to different primitive sizes, wherein a primitive of a first primitive size of the different primitive sizes includes a first number of fluid actuators, and a primitive of a second primitive size of the different primitive sizes includes a second number of fluid actuators, the second number different from the first number.

* * * * *